United States Patent [19]
Yamada

[11] Patent Number: 5,898,611
[45] Date of Patent: Apr. 27, 1999

[54] SRAM WITH HIGH SPEED READ/WRITE OPERATION

[75] Inventor: Takashi Yamada, Tokyo, Japan

[73] Assignee: NEC Corporation, Tokyo, Japan

[21] Appl. No.: 08/940,252

[22] Filed: Sep. 30, 1997

[30] Foreign Application Priority Data

Oct. 2, 1996  [JP]  Japan ..................................... 8-262141

[51] Int. Cl.$^6$ .................................................. G11C 11/00
[52] U.S. Cl. ........................... 365/154; 365/156; 365/63; 365/205; 365/189.11
[58] Field of Search .................................. 365/154, 205, 365/189.11, 189.05, 63, 156

[56] References Cited

U.S. PATENT DOCUMENTS

| | | | |
|---|---|---|---|
| 4,839,862 | 6/1989 | Shiba et al. | 365/154 |
| 4,862,421 | 8/1989 | Tran | 365/189.07 |
| 4,932,002 | 6/1990 | Houston | 365/241 |
| 5,099,452 | 3/1992 | Yamakoshi et al. | 365/63 |
| 5,327,377 | 7/1994 | Kawashima | 365/156 |
| 5,457,647 | 10/1995 | McClure | 365/63 |
| 5,682,343 | 10/1997 | Tomishima et al. | 365/63 |

FOREIGN PATENT DOCUMENTS 7-249292   9/1995   Japan .

OTHER PUBLICATIONS

IEEE International Solid–State Circuits Conference Digest of Technical Papers, 1995, pp.84–85.

*Primary Examiner*—David Nelms
*Assistant Examiner*—Tuan T. Nguyen

[57] ABSTRACT

A semiconductor memory device comprises full-CMOS type memory cell which device can shorten read time and write time of storage information. The memory cell thereof comprises one pair of load transistors, one pair of driving transistors, and one pair of transferring transistors which pair of transistors constitute a flip-flop circuit respectively. In the memory cell, a first pair-of-bit-lines is connected to source/drain side of the pair of transferring transistors, while a second pair-of-bit-lines is connected to source side of the pair of driving transistors. At the read time, signal from the four bit lines is inputted to a sense amplifier, while at the write time, a complementary signal based on write information is applied to both of the first pair-of-bit-lines and the second pair-of-bit-lines from a write buffer.

12 Claims, 18 Drawing Sheets

SRAM WITH HIGH SPEED READ/WRITE OPERATION

BACKGROUND OF THE INVENTION

The present invention relates to a semiconductor memory device comprising full-CMOS type memory cell. More to particularly, this invention relates to a semiconductor memory device in which it causes read/write operation of memory cell data of static random-access memory. (hereinafter referring to SRAM) to implement with high-speed.

DESCRIPTION OF THE PRIOR ART

At the present time, a full-CMOS type SRAM is subjected to high-integration and is required speedup of operation. Hereinafter, technology of the SRAM is explained referring to the drawings.

FIG. 1 is a block diagram showing a circuit of a principal section of SRAM for explaining conventional SRAM. As shown in FIG. 1, memory cells 50 arranged in matrix state are connected to word lines WL which are respective corresponding row lines, and are connected to bit lines D, D-bar which are respective corresponding column lines. In this place, the word lines WL0, WL1, and so forth are connected to a word line decoder 71, while the bit lines D0, D0-bar, D1, D1-bar and so forth are connected to a 2-bit width column selector 54.

Signals of such bit lines D0, D0-bar are of the complementary relation each other, which bit lines are separated from the another columns to form a pair of bit line with two lines in every one column, while earth wire (GND) which supplies low side power source voltage to the memory cell 50 is held in common with earth wire of another column or earth wire of the same column mutuary. Furthermore, when column selection signal, for example, one line of CY0 is selected, the 2-bit width column selector 54 permits one pair of common bit lines CD0, CD0-bar and one pair of bit lines D0, D0-bar corresponding to column selection signal CY0 to connect electrically.

The common bit lines CD0, CD0-bar and so forth are connected to a 2-input sense amplifier 62 and a 2-output write buffer 63. Furthermore, the 2-output write buffer 63 is connected to a data input/output section 70 through a data input/output line I/O. The data input/output section 70 is connected to a write data input line Din0 and a read data output line Dout0. These circuits of column system are controlled by read enable signal RE, write enable signal WE, and so forth generated by control circuit 72.

Next, read operation of the conventional SRAM is explained using FIGS. 1, 2, and 3. As in an initial state, whole bit lines are set to power source potential Vdd of higher side by a pair-of-bit-line pull-up circuit 51. Here, as shown in FIG. 2, a pair-of-bit-line pull-up transistor 101 which constitutes the pair-of-bit-line pull-up circuit 51 is designed that conductive resistance is of comparatively high value. Read of the data of memory cell is started by selecting of one word line corresponding to an address signal such as the word line WL0.

The memory cell connected to the selected word line is connected to the corresponding bit lines D0, D0-bar. A storage-data-terminal R0-bar exists in the side where zero is stored within the memory cell. Electric charge of the bit line D0-bar to which the storage-data-terminal R0-bar is connected, is discharged to the earth wire pursuing a course of an arrow shown in FIG. 2. For this reason, micro-potential difference $\Delta V$ is generated between the bit lines D0 and D0-bar. With respect to amplitude of micro-current $\Delta I$ shown in the drawing, upper limit thereof is determined by saturation current of a transistor 100 for transferring of the memory cell 50.

In the mean while, the 2-input sense amplifier 62 is electrically connected to one pair of bit line in every one thereof through the 2-bit width column selector 54. Above micro-potential difference is propagated to two input terminals of the 2-input sense amplifier 62. The 2-input sense amplifier 62 amplifies the micro-voltage $\Delta V$ to logical level to output to the input/output lines I/O0, I/O0-bar. In order to shorten delayed time required for voltage amplification by the sense amplifier 62, it is preferable to propagate larger micro-potential difference $\Delta V$ to the sense amplifier 62. After termination of read operation, it permits a voltage level of the word line WL0 to fall, the pair-of-bit line is returned to the initial voltage Vdd by the pair-of-bit-line pull-up circuit 51.

Concerning the 2-input sense amplifier 62 of the conventional SRAM, differential amplifier called as current mirror type is used. For example, FIG. 4 shows one example of sense amplifier disclosed in the Japanese Patent Application Laid-Open HEI 7-249292. An N channel transistor Q0 is an N channel MOS transistor which determines an operation current of the differential circuit, in which when read enable signal RE propagated to a gate electrode thereof is high level, the sense amplifier becomes activated state, while when read enable signal RE propagated to the gate electrode thereof is low level, the sense amplifier becomes non-activated state. Since the common bit line CD0 is connected to the gate electrode of the MOS transistors Q2 and Q8, and the common bit line CD0-bar is connected to the gate electrodes of the MOS transistors Q1 and Q6, for example, when potential difference of the CD0-bar as described above falls by the micro-potential difference $\Delta V$, conductive resistance of the P channel transistor Q6 decrease, while conductive resistance of the N channel transistor Q1 increase. As a result, potential difference of the drain of the P channel transistor becomes high, thus bringing rise of the potential difference of the gate electrode of the connected transistors Q3, Q4, Q5, and Q7. Consequently, potential difference of I/O0-bar decreases because of an increase of the conductive resistance of the Q3, and a decrease of the conductive resistance of the Q7. In the right side of FIG. 4, since as to the connection of the common bit lines CD0, CD0-bar is reverse to the left side thereof, potential difference of the input I/O0 increases.

FIG. 5 shows one example of configuration view of sense amplifier called as latch type amplifier, which is described in IEEE INTERNATIONAL SOLID-STATE CIRCUITS CONFERENCE DIGEST OF TECHNICAL PAPERS, 1995, pages 84–85. FIG. 6 is a wave form chart at the time when read operation using sense amplifier shown in FIG. 5 is implemented.

In this configuration of the sense amplifier, although when the word line of the memory cell section rises, the read enable signal RE does not rise yet, thereby the whole pair-of-bit-line of the 2-bit width column selector 54 become non selected state, and the 2-input sense amplifier 62 becomes non-activated state. At this time, the output terminals I/O0, I/O0-bar are fixed to low level by the P channel transistors M1, M2, thereby the P channel transistors M3, M4 are of the electrical continuity.

Here, when the electric potential of the bit line D0-bar decreases due to the current flowing through the memory cell 50, and when the potential difference is generated enough to implement voltage amplification by the 2-input sense amplifier 62, the read enable signal RE rises with this timing, thus the N channel transistor M0 becomes electrical continuity, and the 2-input sense amplifier 62 comes into activated state. At the same time, the column selection signal CY0 is generated, and the pair of bit lines D0, D0-bar in every sense amplifier are connected thereto electrically. After column selection, immediately, the electric charge of the bit lines D0, D0-bar flows into the output terminals I/O0, I/O0-bar through the P channel transistors M3, M4, and transiently, N channel transistors M5, M6 are subjected to electrical continuity so that a part of electric charge is discharged to the earth wire. However, since electric potential of the bit line D0-bar is lower than that of the bit line D0 by $\Delta V$, electric potential of I/O0-bar becomes low rather than electric potential of I/O with a small quantity. The P channel transistors M3, M4, the M channel transistors M5, M6 constitute inverter-latch thereby a small potential differences between I/O0 and I/O0-bar are amplified so that I/O0 becomes high level, while I/O0-bar becomes low level. Although the electric potential of the bit lines D0, D0-bar descends to some degree due to the flow of the electric charge to the output terminals I/O0, I/O0-bar, the electric potential thereof is returned to the power source potential Vdd by the pair-of-bit-line pull-up circuit 51.

Next, write operation is explained using FIGS. 7 and 8. Here, FIG. 7 is a write operation view showing wave-form of principal signal of write operation.

Similar to the read operation described above, write enable signal WE rises, one of word line WL0 is selected, and the storage data terminals R0, R0-bar within the memory are electrically connected to the corresponding bit lines D0, D0-bar respectively.

In the meanwhile, the 2-output write buffer 63 is electrically connected to the pair of the bit line in every thereof due to the 2-bit-width column selector 54. The 2-output write buffer 63 drives one side of bit lines into the power source potential Vdd (D0-bar in the drawing), and drives another side of bit lines into ground potential Vss (D0 in the drawing) in accordance with the write data of I/O, I/O-bar.

The bit lines D0, D0-bar and the memory cell 50 implement change of electric charge pursuing the course shown in the drawing, thus the write data inputted from the I/O0, I/O0-bar is stored the storage data terminal R0, R0-bar within the memory cell. At this time, with regard to the amplitude of current $\Delta I$, upper limit is determined by saturation current of the transistor 100 for transferring of the memory cell 50.

After termination of write operation, the 2-output write buffer 63 becomes output of high impedance, thus the pair of the bit lines D0, D0-bar returns to the initial potential Vdd due to the pair-of-bit-line pull-up circuit 51.

In general, the semiconductor memory device such as SRAM is loaded with enormous number of memory cells. For this reason, a gate width of the respective MOS transistors constituting memory cell are formed very small with an intention to lessen an area, thus current flowing the memory cells is small. Although parasitic capacitance greatly increases, a large number of memory cells are connected to the respective bit lines, because of the intention to lessen the area.

In the read operation of such the SRAM, there is adopted a method that it causes electric charge of the bit line with large parasitic capacitance to discharge by small current flowing into the memory cells. However in this method, the potential difference of the pairs of bit line generated by the read of the memory data is small, so that amplifying time of the sense amplifier becomes long. There is a defect that propagation delay time from selection of the word line to an output of the sense amplifier, namely cell read time becomes long.

With respect to the write operation, there is the same defect as that of the read operation. In the write operation, read data is stored within the memory cell due to delivery and receipt of the electric charge between the bit line and the inside of the memory cell.

For this reason, there is brought an increase of cell-write-time caused by the fact that parasitic capacitance of the bit line is large, while current flowing the memory cell is small. When inversion storage data is written into the memory cell, write time increases greatly.

SUMMARY OF THE INVENTION

In view of the foregoing, it is an object of the present invention for achieving the above-mentioned problem to provide a semiconductor memory device of SRAM constituted by full CMOS type memory cell which can shorten a memory cell read time and a memory cell write time.

In accordance with an embodiment of the present invention, for achieving the above mentioned object, there is provided a semiconductor memory device consisting of a full CMOS type memory cell in which pair-of-bit-line connected to respective memory cells, in addition thereto, wiring connected to two terminals of earth wiring side of the memory cell are utilized as a signal line being second-pair-of-bit-line.

Namely, a memory cell comprises a pair of load transistors, a pair of driving transistors, and a pair of transferring transistors which pair of transistors constitute a flip-flop circuit, the memory cell comprises a first-pair-of-bit-lines connected to side of a source and a drain of the pair of transferring transistors, and a second-pair-of-bit-lines connected to side of a source of the pair of driving transistors.

Here, in the above embodiment, the first-pair-of-bit-lines and the second-pair-of-bit-lines are connected to a sense amplifier circuit having four input terminals.

While in the above embodiment, the first-pair-of-bit-lines and the second-pair-of-bit-lines are connected to four output terminals of a write buffer circuit respectively.

Then, in the above embodiment, in read time of information for the memory cell, a complementary signal is generated between the first-pair-of-bit-lines by flowing of current from the first bit line into the second bit line through the transferring transistors and the transistor for driving within the memory cell, simultaneously a complementary signal is also generated between the second-pair-of-bit-lines due to the current, thus the sense amplifier circuit implements amplification of read information using both of the complementary signal of the first- pair-of-bit-lines and the complementary signal of the second-pair-of-bit-lines.

While, in the above embodiment, in write time of information for the memory cell, the write buffer circuit outputs a complementary signal based on the write information to both of the first-pair-of-bit-lines and the second-pair-of-bit-lines, and outputs a equiphase-signal to both of one side of the first bit line of the first-pair-of-bit-lines and one side of the second bit line adjacent to the one side of the first bit line of the second-pair-of-bit-lines.

Here, in the above embodiment, the complementary signal outputting to the second-pair-of-bit-line is a micro signal.

While, in the above embodiment, in the memory cell array section, the first-pair-of-bit-lines and the second-pair-of-bit-lines are arranged in the same direction in parallel, one side the first bit line of the first-pair-of-bit-lines is electrically connected to other side the second bit line which is kept away from the one side first bit line, of the second-pair-of-bit-lines through both the transferring transistors and the driving transistors.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the present invention will now be described in detail referring to the accompanying drawings.

Figure 9:
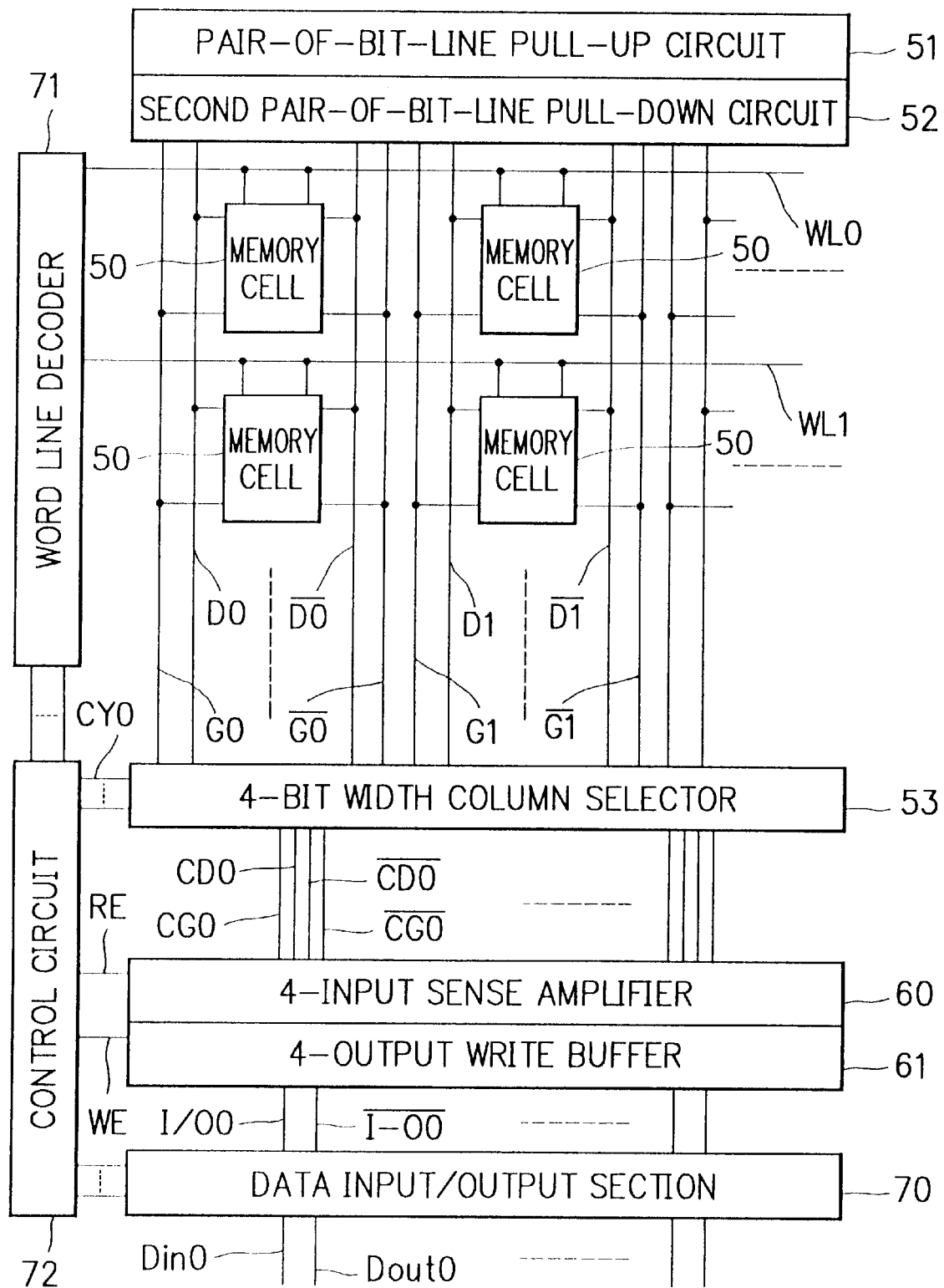
FIG. 9 is a block diagram showing principal section of SRAM for explaining embodiments according to the present invention.

A first embodiment of the present invention will be explained. FIG. 9 is a block diagram of a principal circuit section constituting SRAM of the present invention. Here, explanations of the same elements as that of the prior art which elements are explained using the same marks as that of the prior art described above are omitted.

As shown in FIG. 9, a pair-of-bit-lines D0, D0-bar and a second pair-of-bit-lines G0, G0-bar are wired independently in parallel with each other. Consequently, in this memory cell array section, the pair-of-bit-lines D0, D0-bar and the second pair-of-bit-lines G0, G0-bar are not held another bit line and another second bit line in common. Two terminals of the earth wire side of the memory cell 50 are connected to the second pair-of-bit-lines G0, G0-bar. The bit lines D0, D0-bar which come into a first pair-of-bit-lines are connected to a pair-of-bit-line pull-up circuit 51 which is similar to that of the conventional SRAM, while the second bit lines G0, G0-bar which come into a second-pair-of-bit- lines are connected to a second pair-of-bit-line pull-down circuit 52.

A 4-bit width column selector 53, a 4-input sense amplifier 60, and a 4-output write buffer 61 are connected to both of respective pairs of bit lines and the second bit line.

For this reason, column selector for 4-bit width, sense amplifier for 4-input, and write buffer for 4-output are used.

Figure 10:
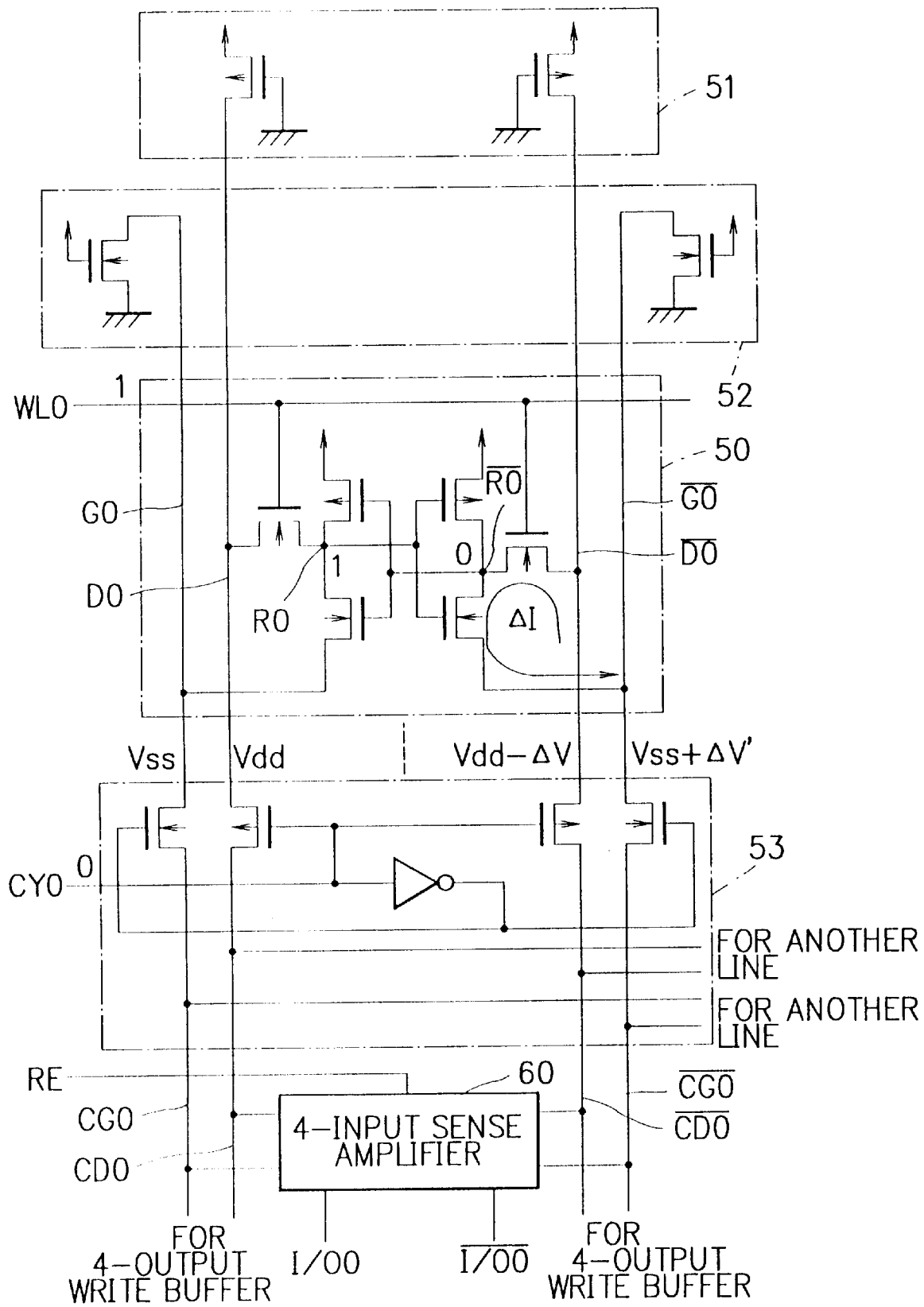
FIG. 10 is a read operation view of SRAM according to a first embodiment of the present invention.
Figure 11:
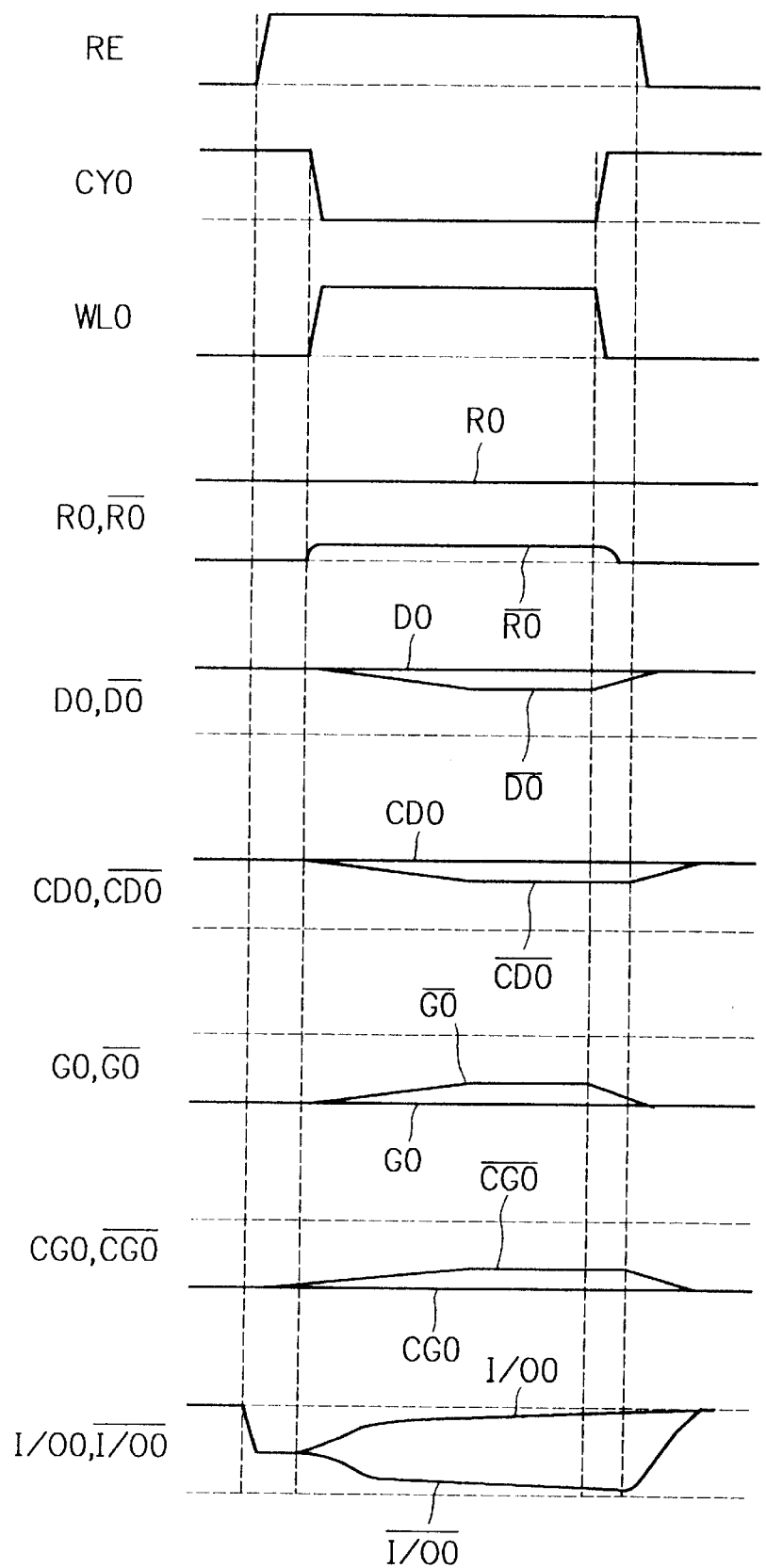
FIG. 11 is a wave form chart of principal signal in read operation of FIG. 10.

Next, read operation of the SRAM of the present invention will be explained using FIGS. 10 and 11. Here, FIG. 10 is a read operation view of the SRAM of the present invention. FIG. 11 is a wave form chart of principal signal in the read operation.

An initial electric potential of the bit lines D0, D0-bar is set to power source potential Vdd by the pair-of-bit-line pull-up circuit 51, and an initial electric potential of the second bit lines G0, G0-bar is set to ground potential Vss by the second pair-of-bit-line pull-down circuit 52. Here, in the respective MOS transistors which constitute the pair-of-bit-lines pull-up circuit 51, and in the respective MOS transistors which constitute the second pair-of-bit-lines pull-down circuit 52, conductive resistance thereof is designed so as to become comparatively high.

The read operation of the SRAM of the present invention is the same operation as that of the conventional SRAM, in that one word line is selected.

A storage-data-terminal R0-bar exists in the side where zero is stored within the memory cell. Electric charge of the bit line D0-bar to which the storage-data-terminal R0-bar is connected, is discharged to the earth wire pursuing a course of an arrow shown in FIG. 10. For this reason, micro-potential difference $\Delta V$ is generated between the bit lines D0 and D0-bar. Thus the electric potential of the bit line D0-bar drops by very small value $\Delta V$.

While, the second bit line connected to the terminal of earth wire side of the memory cell is grounded through the MOS transistor of high resistance thereby the electric potential of the second bit line G0-bar at the side of R0-bar rises with very small potential $\Delta V'$.

The first pair-of-bit-line, and the second pair-of-bit-line which are selected by the 4-bit width column selector 53 are electrically connected to the 4-input sense amplifier 60. At this time, the electric potential inputted to the sense amplifier 60 is four kinds of electric potentials. Namely, in the conventional case of SRAM, the electric potential to be inputted is the power source potentials Vdd and Vdd $-\Delta V$, while in the present invention of SRAM, the electric potentials to be inputted are four kinds of Vdd, Vdd $-\Delta V$, Vss, and Vss $+\Delta V'$. For this reason, as shown in FIG. 11, voltage of I/O0, and I/O0-bar are ascertained in a short time.

In the present invention, at the time of read-out, the above four kinds of signals are fetched from the memory cells, there is implemented the voltage amplification effectively by utilizing these signals to shorten the read time of the memory cells with intention.

Figure 12:
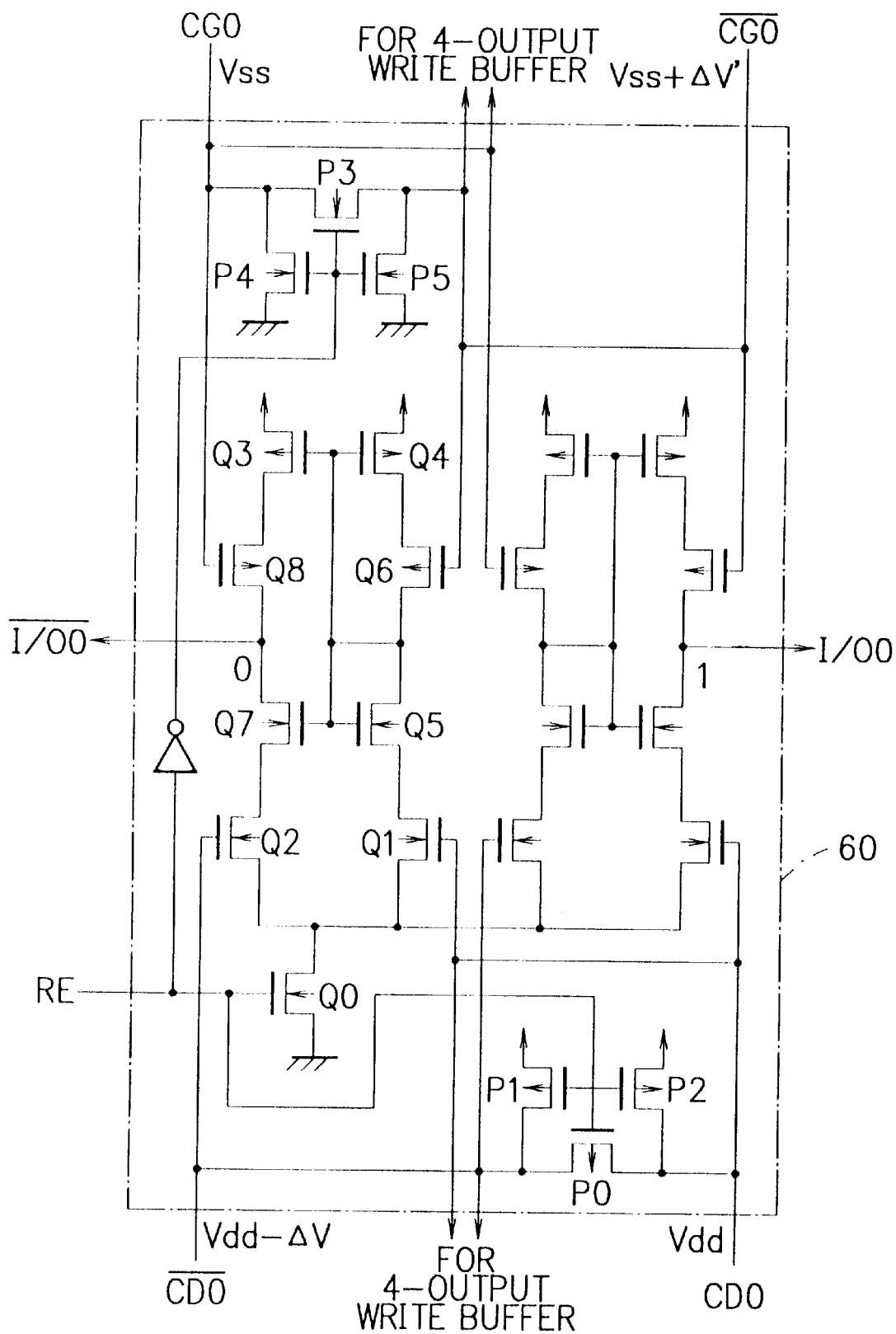
FIG. 12 is a first circuit diagram of sense amplifier section used for read operation of FIG. 10.

FIG. 12 is a first example of 4-input sense amplifier which is submitted for the SRAM of the invention. Among the transistors whose gate electrode is connected to the pair of bit lines, the P channel transistor is connected to the second common bit lines CG0, CG0-bar, while the N channel transistor is connected to the common bit lines CD0, CD0-bar. Furthermore, the N channel transistor whose gate electrode is connected to the CD0 is connected to the P channel transistor whose gate electrode is connected to the CG0-bar in series. The N channel transistor whose gate electrode is connected to the CD0-bar is connected to the P channel transistor whose gate electrode is connected to the CG0 in series.

Figure 1:
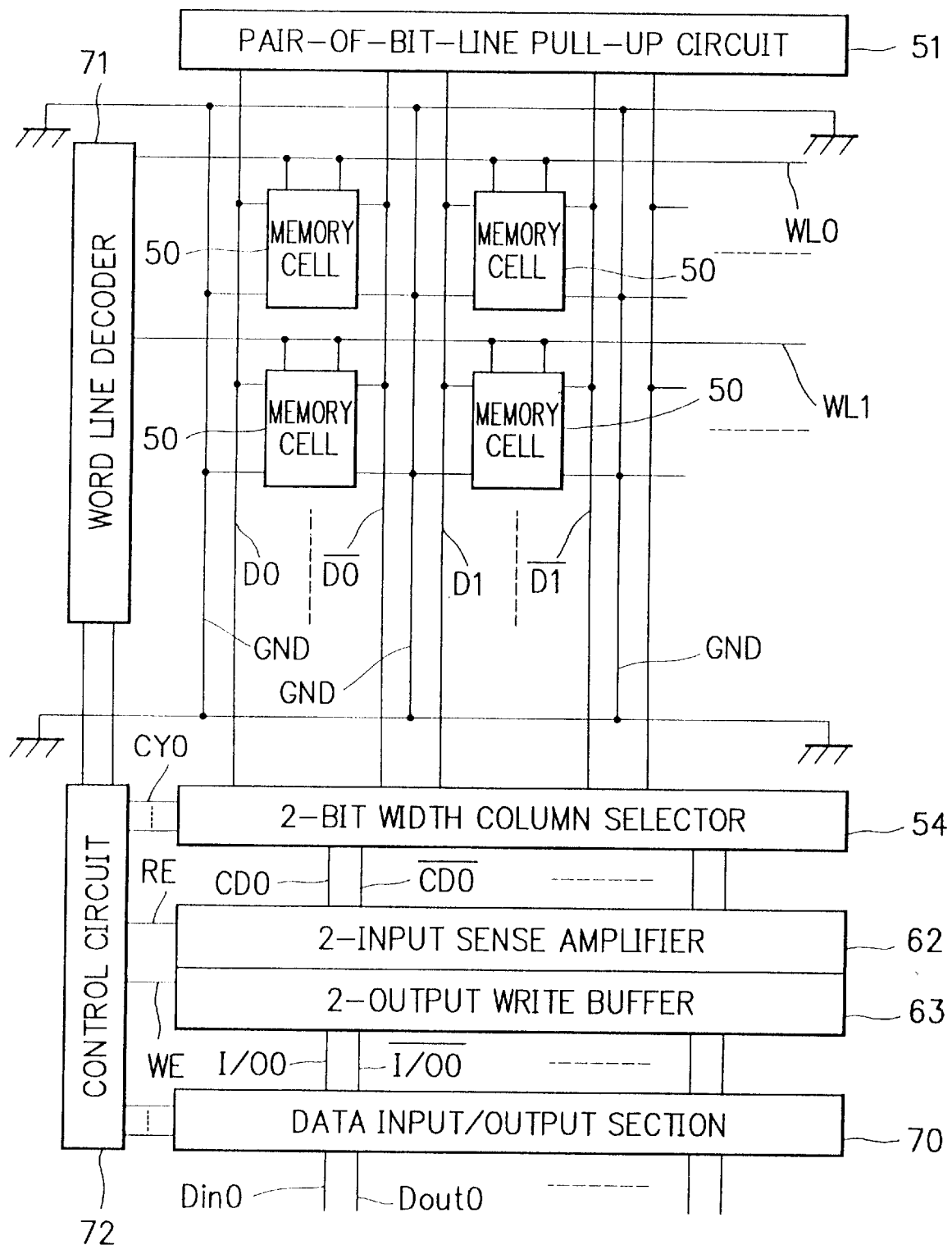
FIG. 1 is a block diagram showing a principal section of conventional SRAM.
Figure 2:
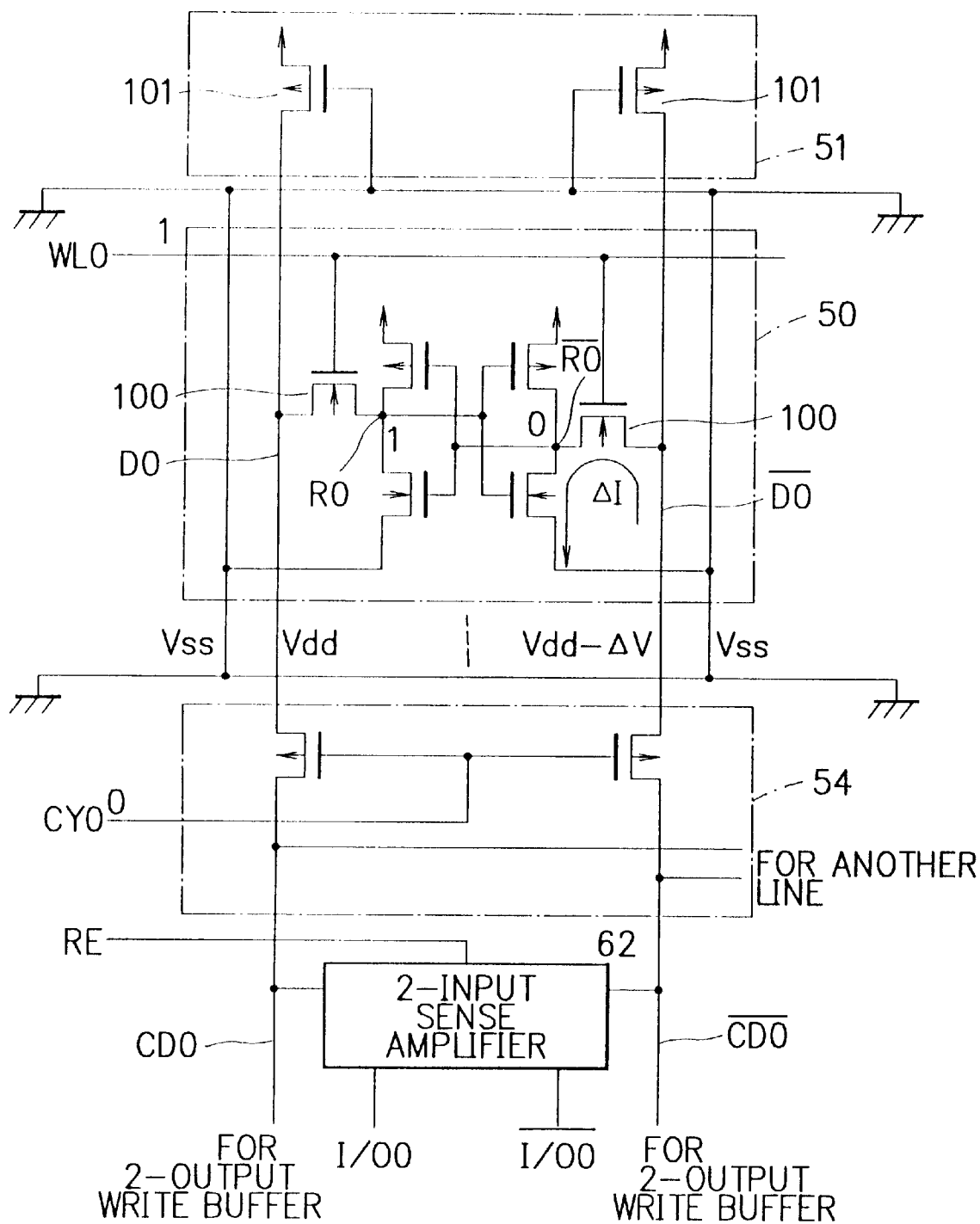
FIG. 2 is a read operation view of the conventional SRAM.
Figure 3:
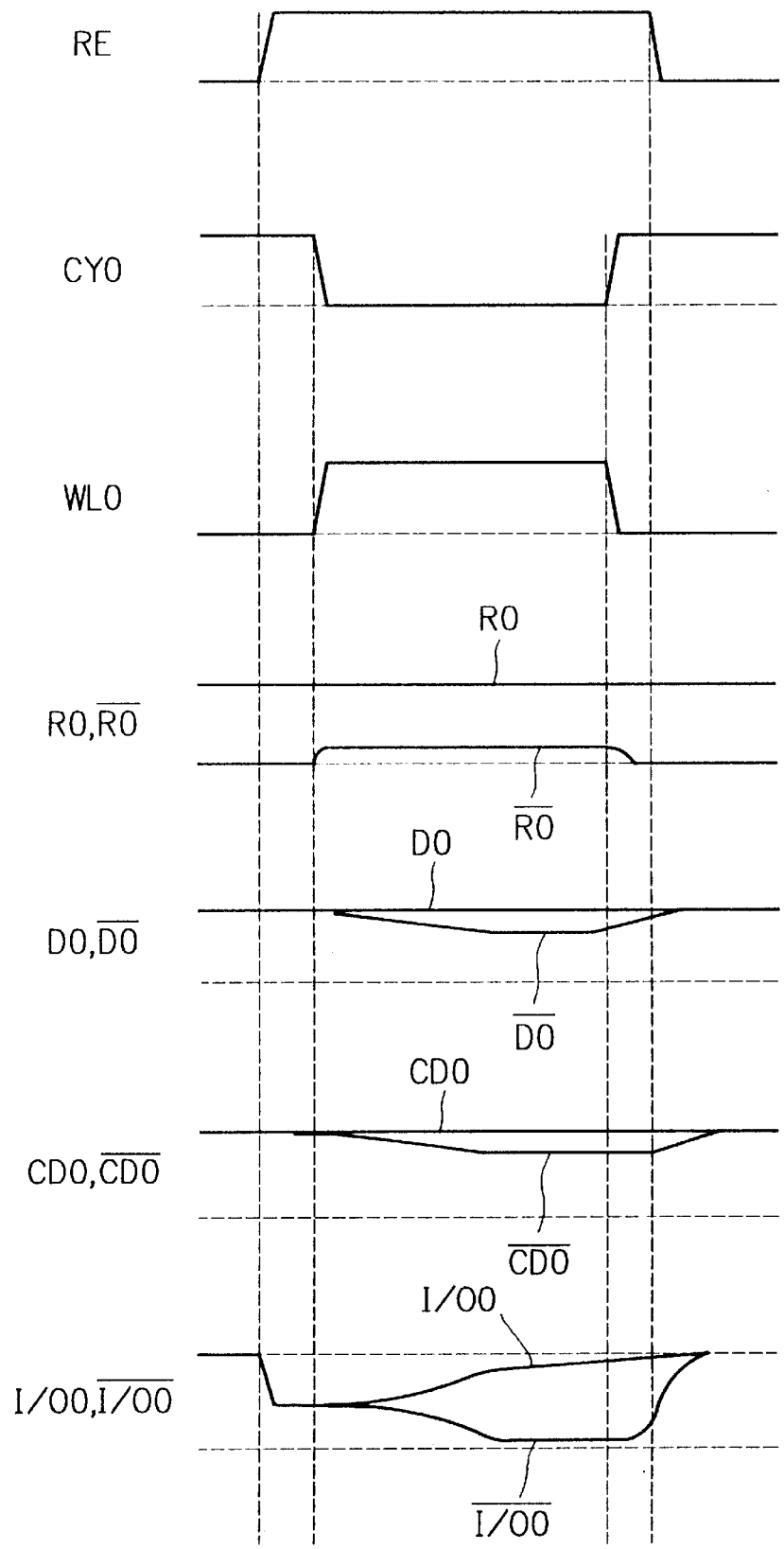
FIG. 3 is a wave form chart of signal showing a read operation of the conventional SRAM.
Figure 4:
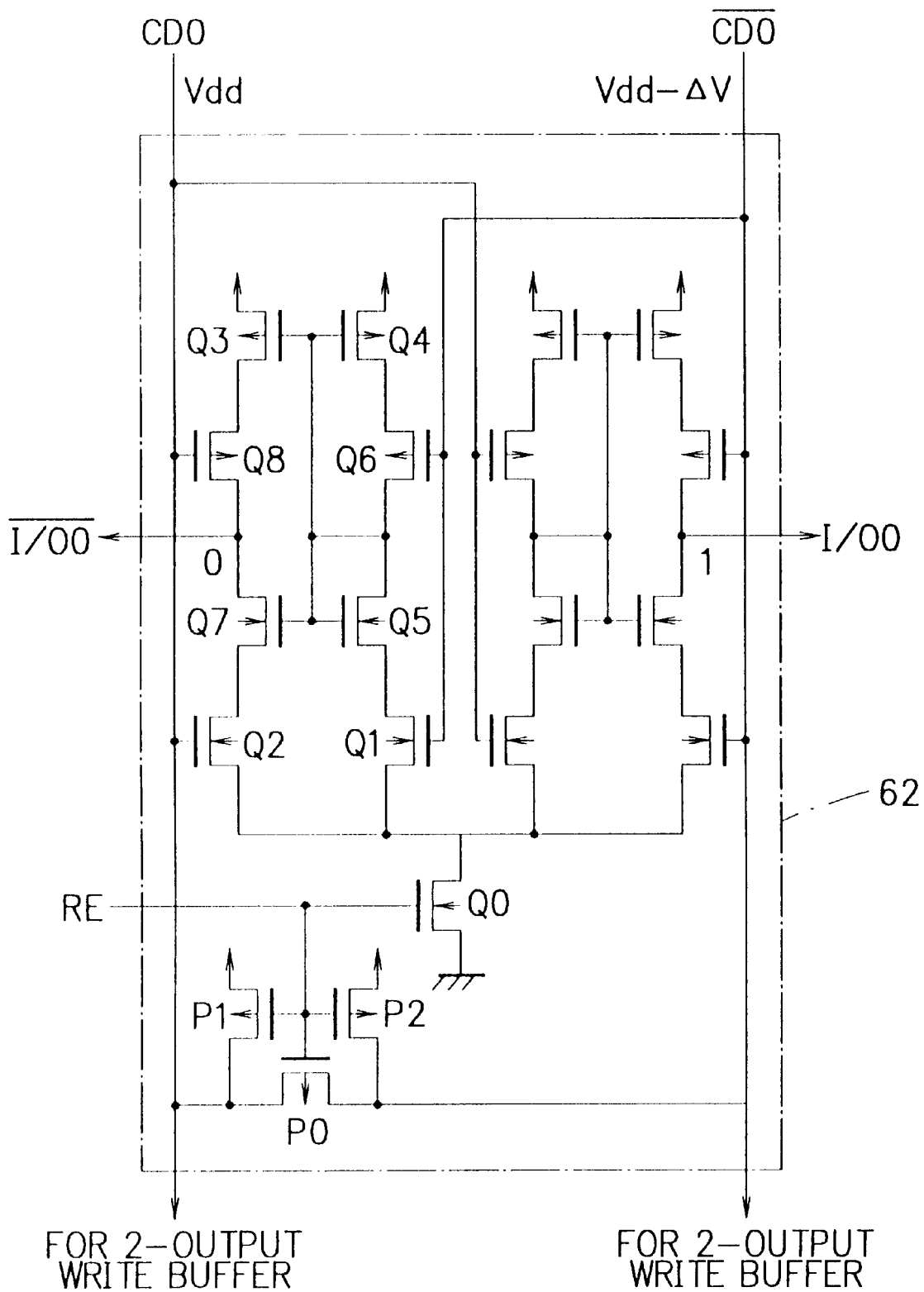
FIG. 4 is a first circuit diagram of a sense amplifier section used for conventional read operation.

In the sense operation, difference between the present invention of FIG. 12 and the prior art of FIG. 4 is as follows: in the sense amplifier of the invention, the electric potential applied to the gate electrode of the P channel transistor becomes in the neighborhood of the grounded potential Vss. In general, concerning the MOS transistor, the larger the potential difference between the source and the gate is, the larger the mutual conductance is. Consequently, in the present sense amplifier, quantity of change of the conductive resistance of four P channel transistors whose electrodes are connected to the second common bit lines CG0, CG0-bar is large. For this reason, delay time required for the voltage amplification of the sense amplifier is shortened.

Figure 5:
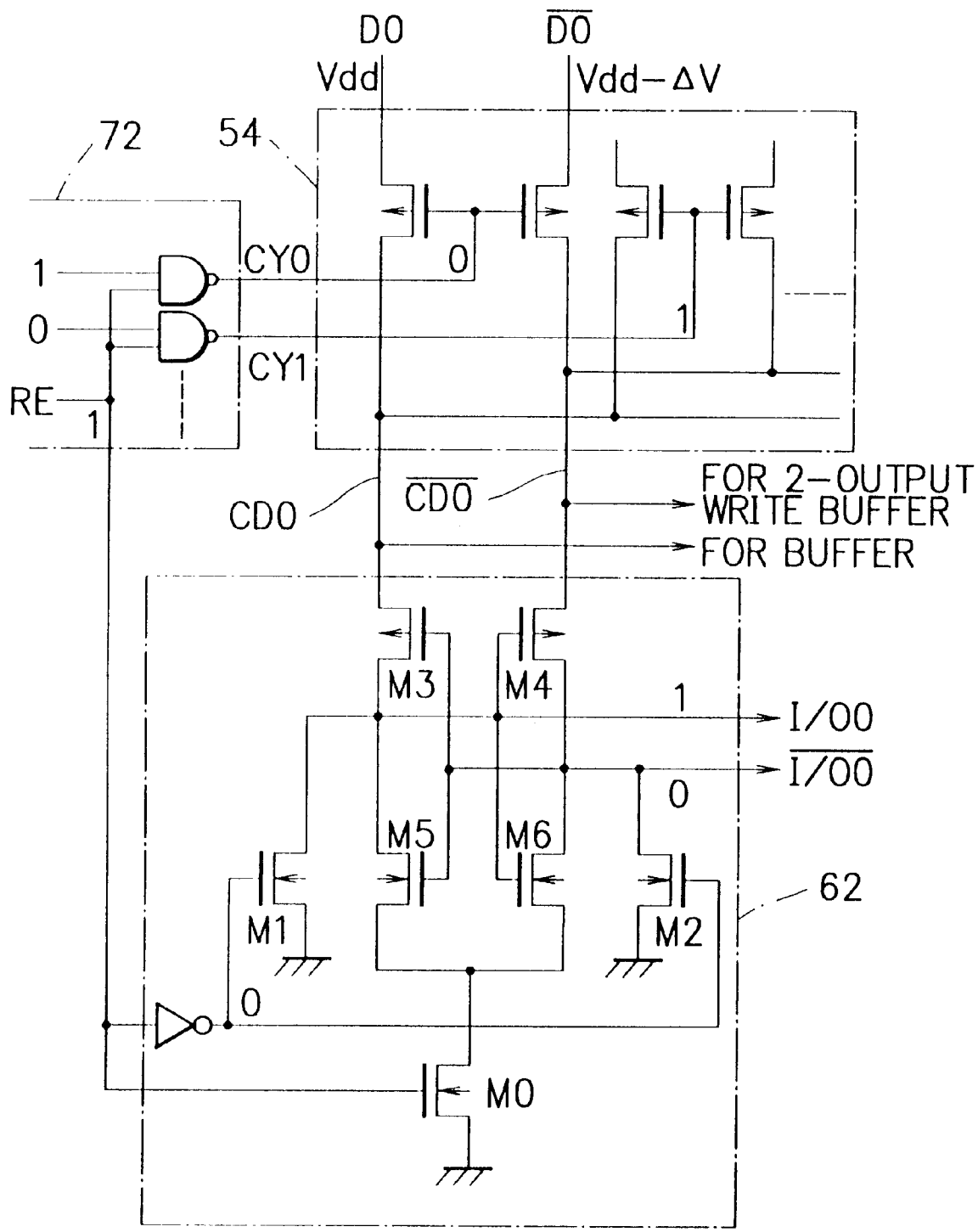
FIG. 5 is a second circuit diagram of a sense amplifier section used for conventional read operation.
Figure 13:
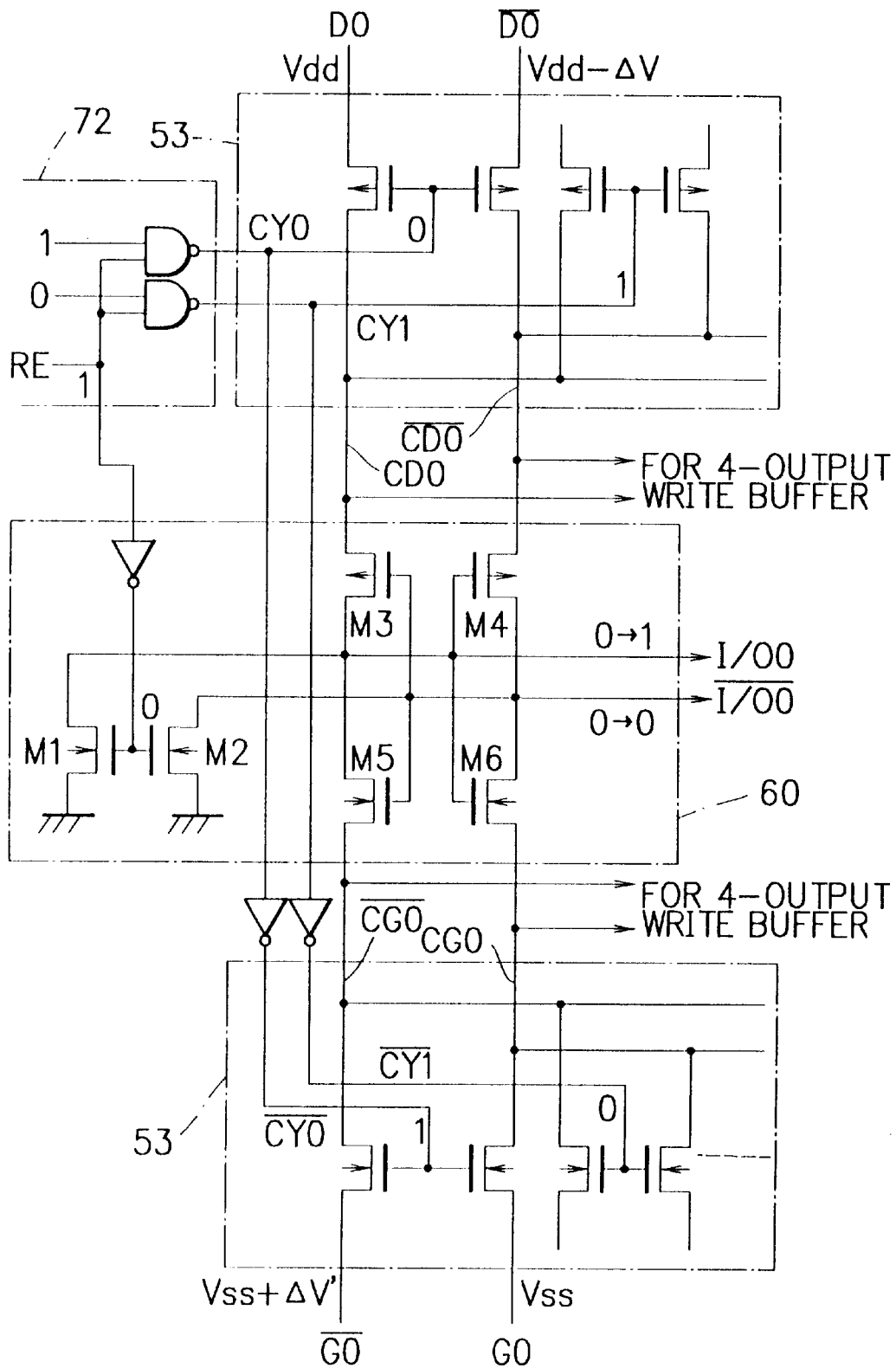
FIG. 13 is a second circuit diagram of sense amplifier section used in SRAM of the present invention.

FIG. 13 shows a second example of 4-input sense amplifier used for the SRAM of the present invention. Difference between the present one and the prior art technology of FIG. 5 is that the N channel transistor M10 is removed, and the source sides of the N channel transistors M5, M6 are connected to the second bit lines G0, G0-bar through the 4-bit width column selector 53.

Figure 6:
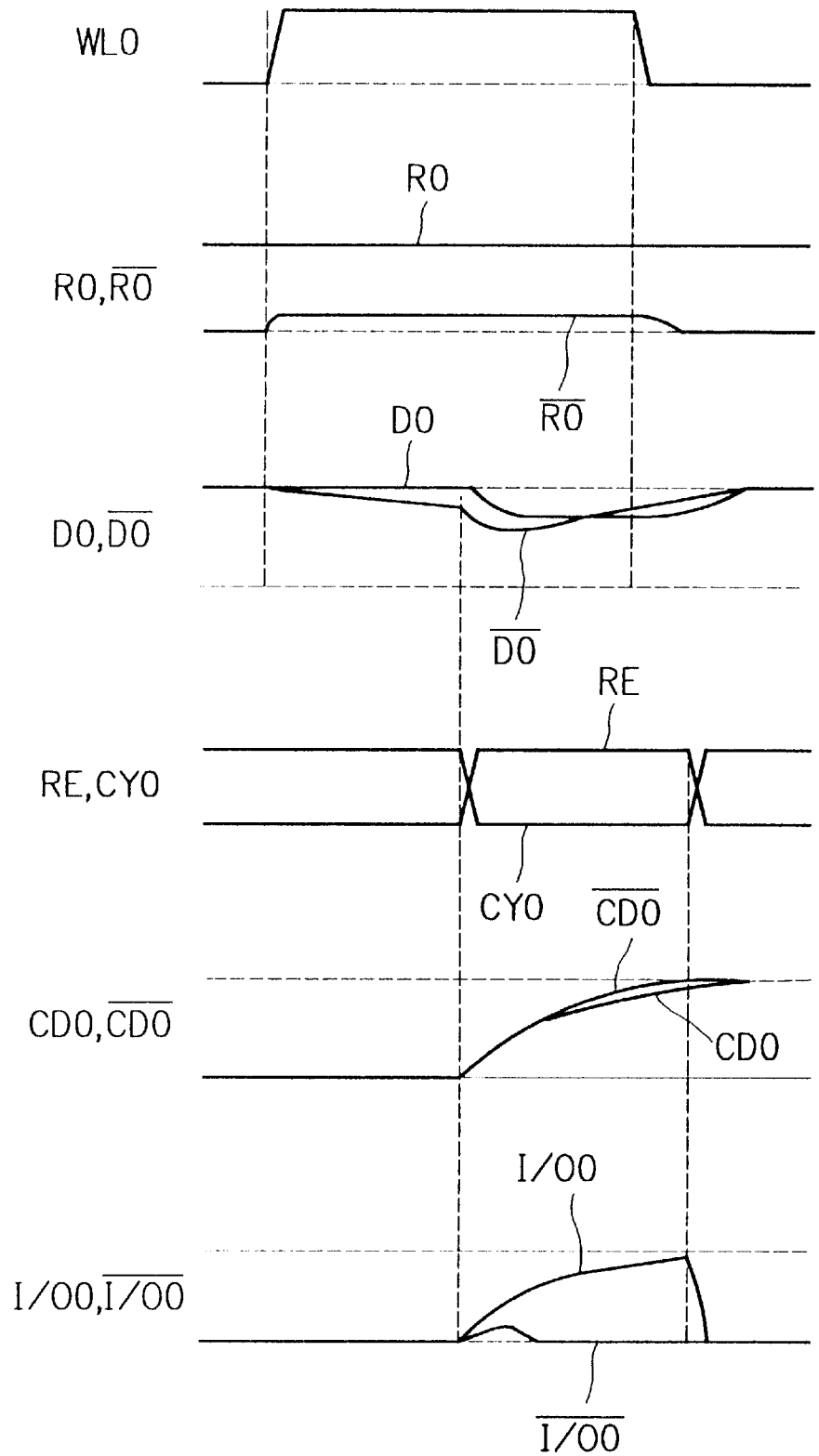
FIG. 6 is a wave form chart of principal signal in read operation using the above second circuit diagram.
Figure 7:
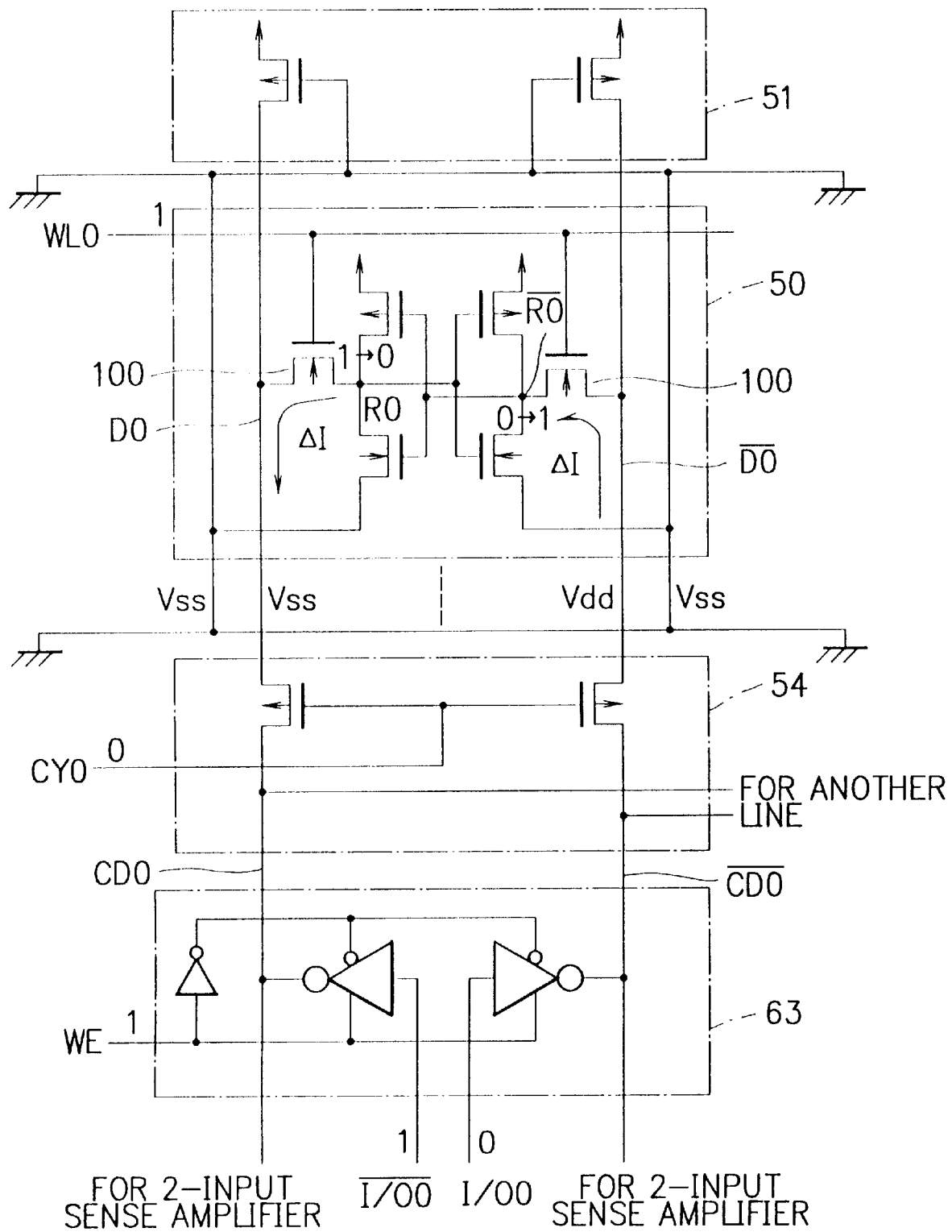
FIG. 7 is a read operation view of the conventional SRAM.
Figure 8:
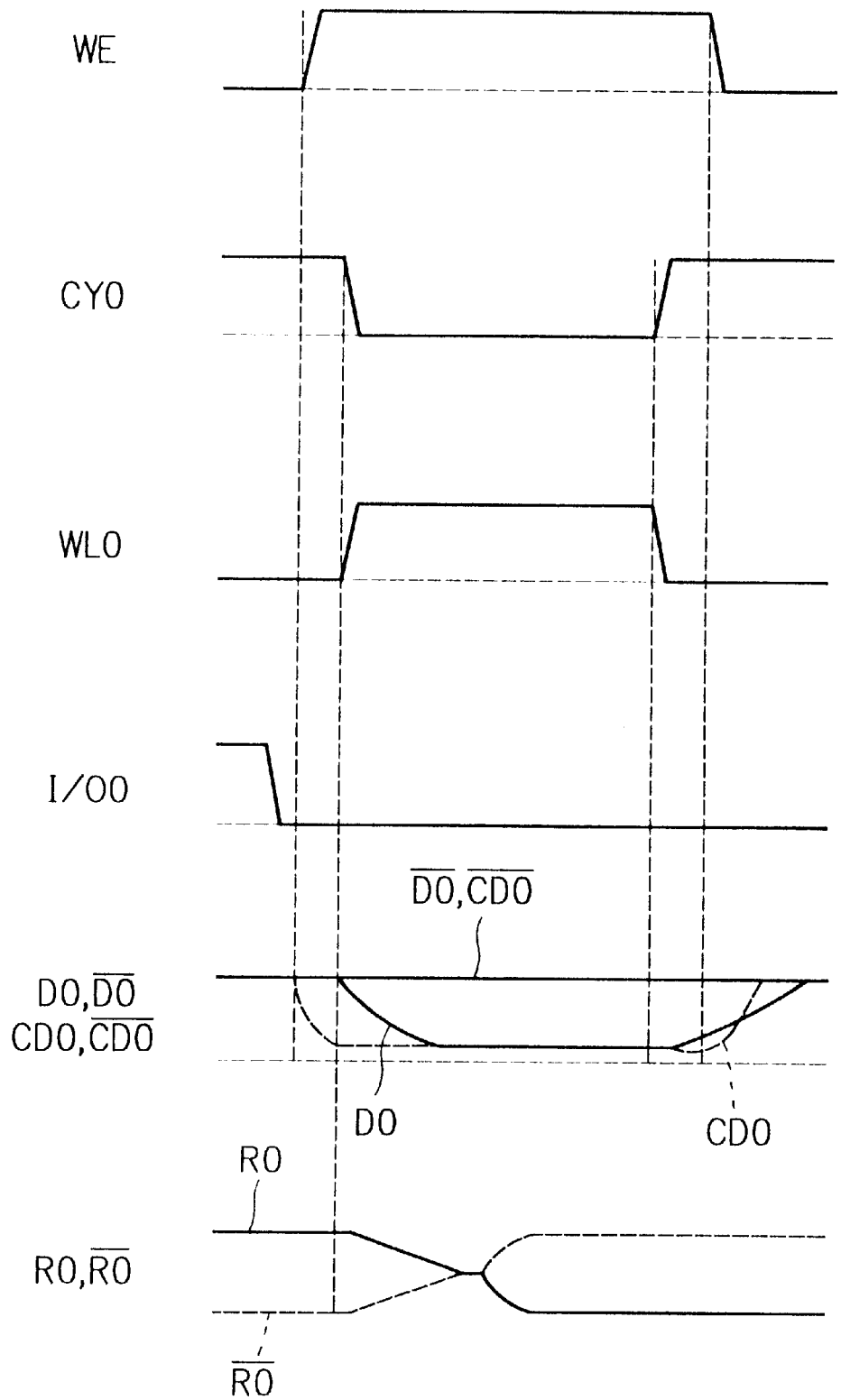
FIG. 8 is a wave form chart of principal signal in write operation of FIG. 7.
Figure 14:
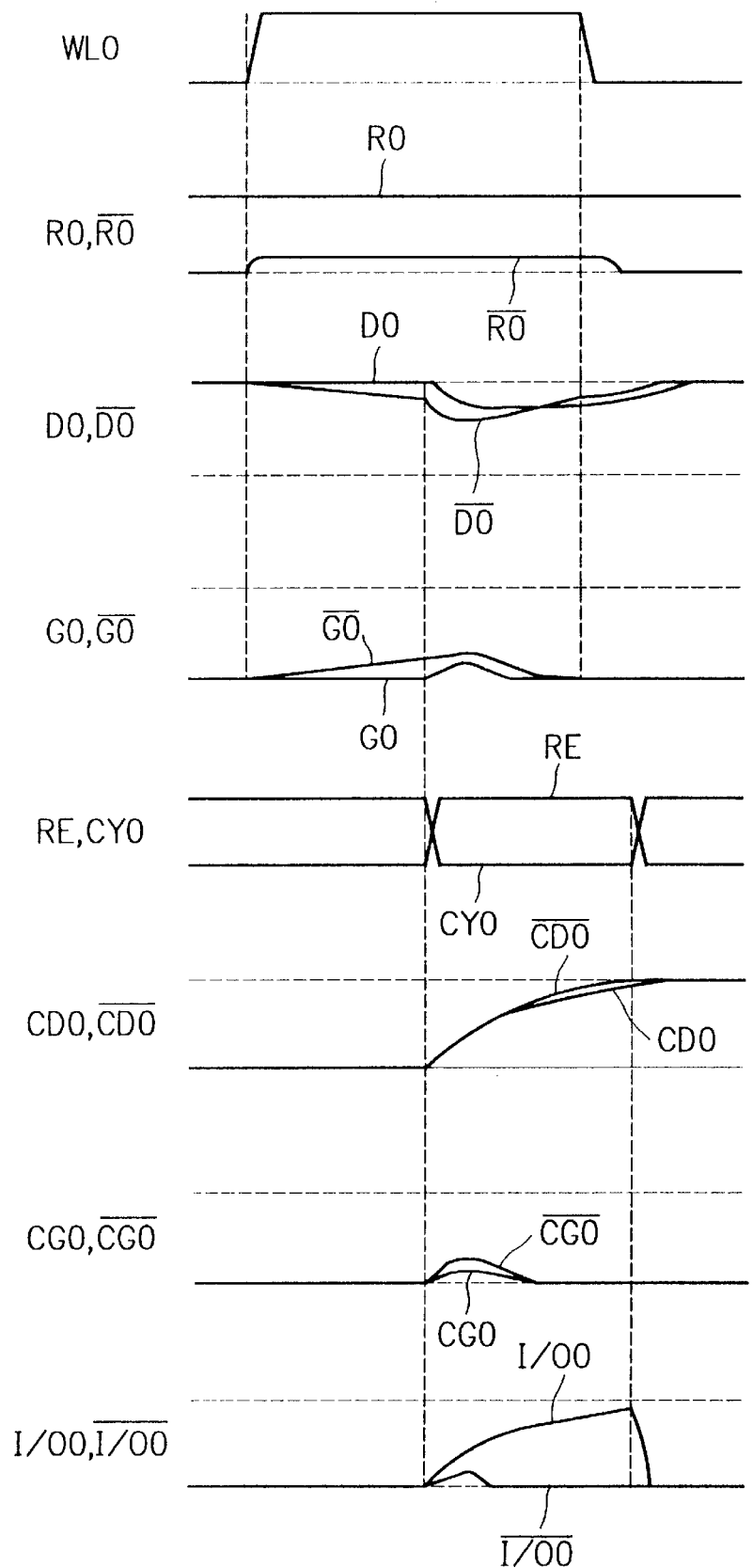
FIG. 14 is a wave form chart of principal signal in read operation using the second circuit diagram of FIG. 13.

FIG. 14 is a timing chart of a read operation in which the 4-input sense amplifier shown in FIG. 13 is applied. Difference between the read operation of the embodiment and that of the prior art of FIGS. 5 and 6 is that since the second bit lines G0, G0-bar are grounded through the MOS transistor of high resistance, the electric potential of the second bit line G0-bar at the side of R0-bar rises by $\Delta V'$.

When the sense amplifier 60 comes into activated state because a read enable signal RE rises, one pair of bit lines D0, D0-bar in every one sense amplifier are electrically connected thereto, and in addition, the corresponding one pair of bit lines G0, G0-bar are electrically connected thereto. Immediately, the electric charge of the bit lines D0, D0-bar flows into the data input/output lines I/O0, I/O0-bar through the P channel transistors M3, M4, thus the electric charge of both lines rises in some degree, simultaneously, one pair of the second bit lines G0, G0-bar and one pair of the second common bit lines CG0, CG0-bar come into the same electric potential.

At this time, the source potential of the N channel transistor MS of FIG. 13 is higher than the grounded potential Vss with a small quantity thereof due to the electric charge flowing therein from the second bit line G0-bar. Consequently, concerning the N channel transistor MS, although the gate potential rises temporarily, conductive current scarcely flows, thereby a rise of electric potential of the output terminal I/O0 becomes steep. Flip-flops consisting of the transistors M3, M4, M5, and M6 are ascertained at high speed.

Figure 15:
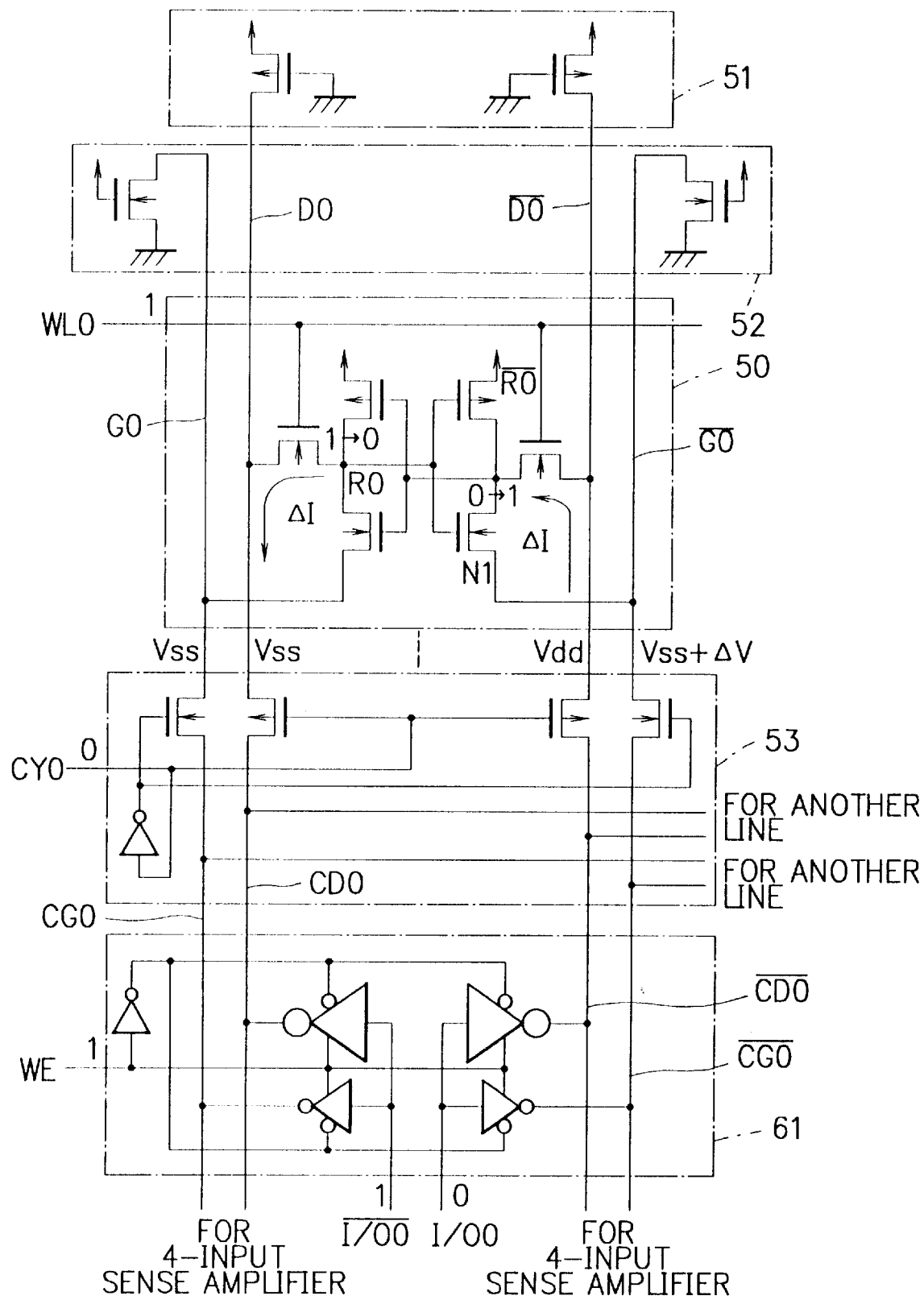
FIG. 15 is a write operation view of SRAM according to the first embodiment of the present invention.
Figure 16:
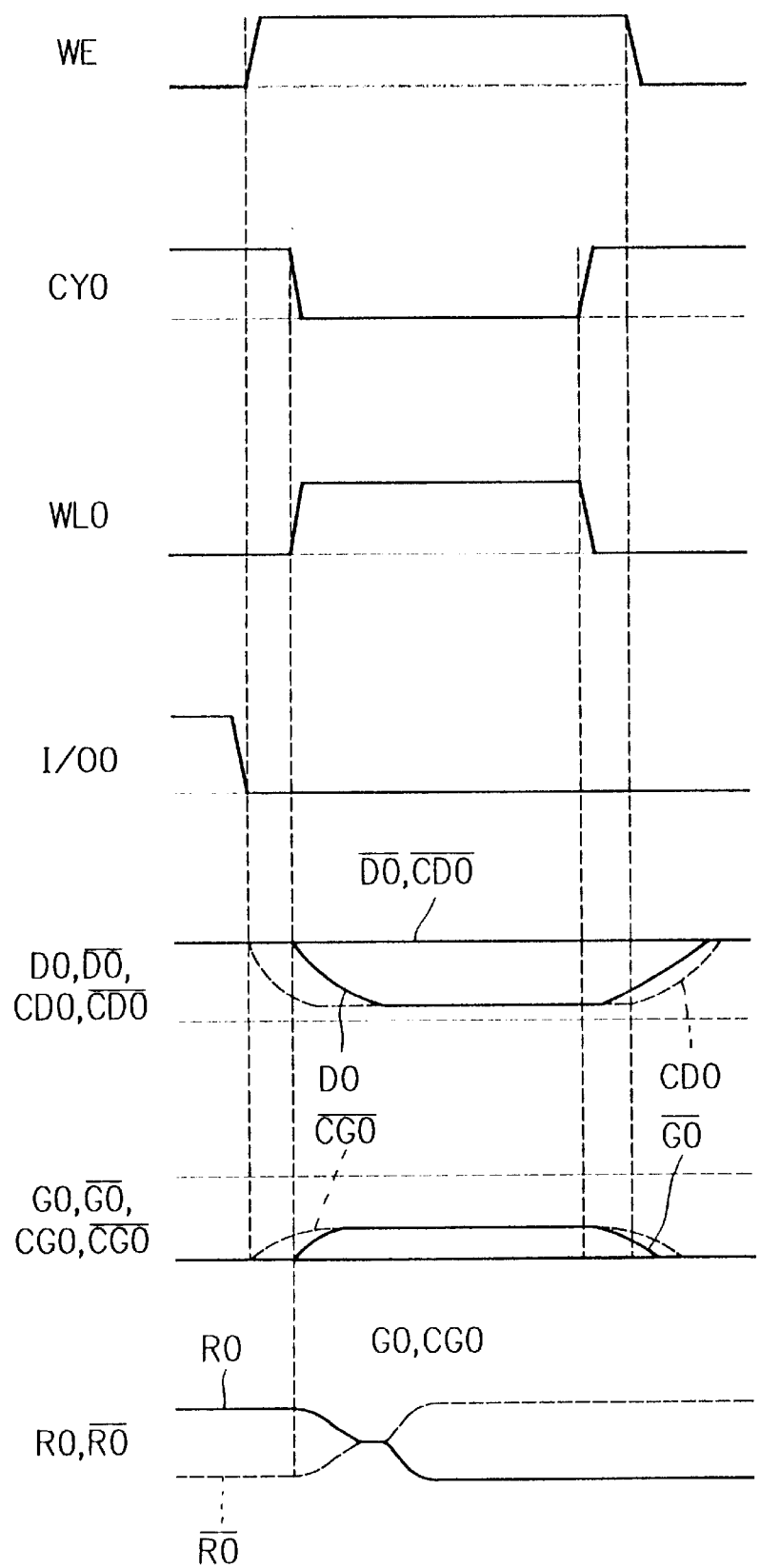
FIG. 16 is a wave form chart of principal signal in the write operation of FIG. 15.

Next, write operation of the SRAM of the present invention will be explained using FIGS. 15 and 16. Here, FIG. 15 is a write operation view, and FIG. 16 is a wave form chart in this operation. As shown in FIGS. 15 and 16, among four inverters with switch which inverters constitute 4-output write buffer 61, two inverters with switch connected to the second common bit lines CG0, CG0-bar are constituted by the transistors with high value of conductive resistance. Consequently, in a complementary write data signal inputted to a pair of bit line D0, D0-bar through the 4-bit width column selector 53 from the 4-output write buffer 61, one side is the power source potential Vdd, the other side is approximately grounded potential Vss, while in a complementary write data signal inputted to the second bit line G0, G0-bar, one side is the grounded Vss, the other side is micro potential Vss $+\Delta V$. On account of this, breakdown of the data of the memory cell whose word line is not selected can be prevented.

Here, remaining another operations are the same as that of the prior art.

In the meantime, since the second bit line G0-bar is connected to the terminal of earth wire side of the memory cell 50, when the 4-bit line column selector 53 is selected, the source potential of the N channel transistor N1 comes into Vss $+\Delta V$. When the word line WL0 rises, the current $\Delta I$ flows from the bit line D0-bar to the storage data terminal R0-bar within the memory cell, and from the storage data terminal R0 within the memory cell to the bit line D0. At this time, the source potential of the N channel transistor N1 is higher than the grounded potential Vss thereby the conductive current of N1 becomes small. Consequently, the electric potential of R0-bar rises quickly, while the electric potential of R0 corresponding thereto falls quickly. This is the principle that the present invention is capable of shortening write time of the cell data.

Next, a second embodiment of the present invention will be explained referring to FIG. 17. Here, FIG. 17 is a read operation view in the second embodiment of the present invention.

Figure 17:
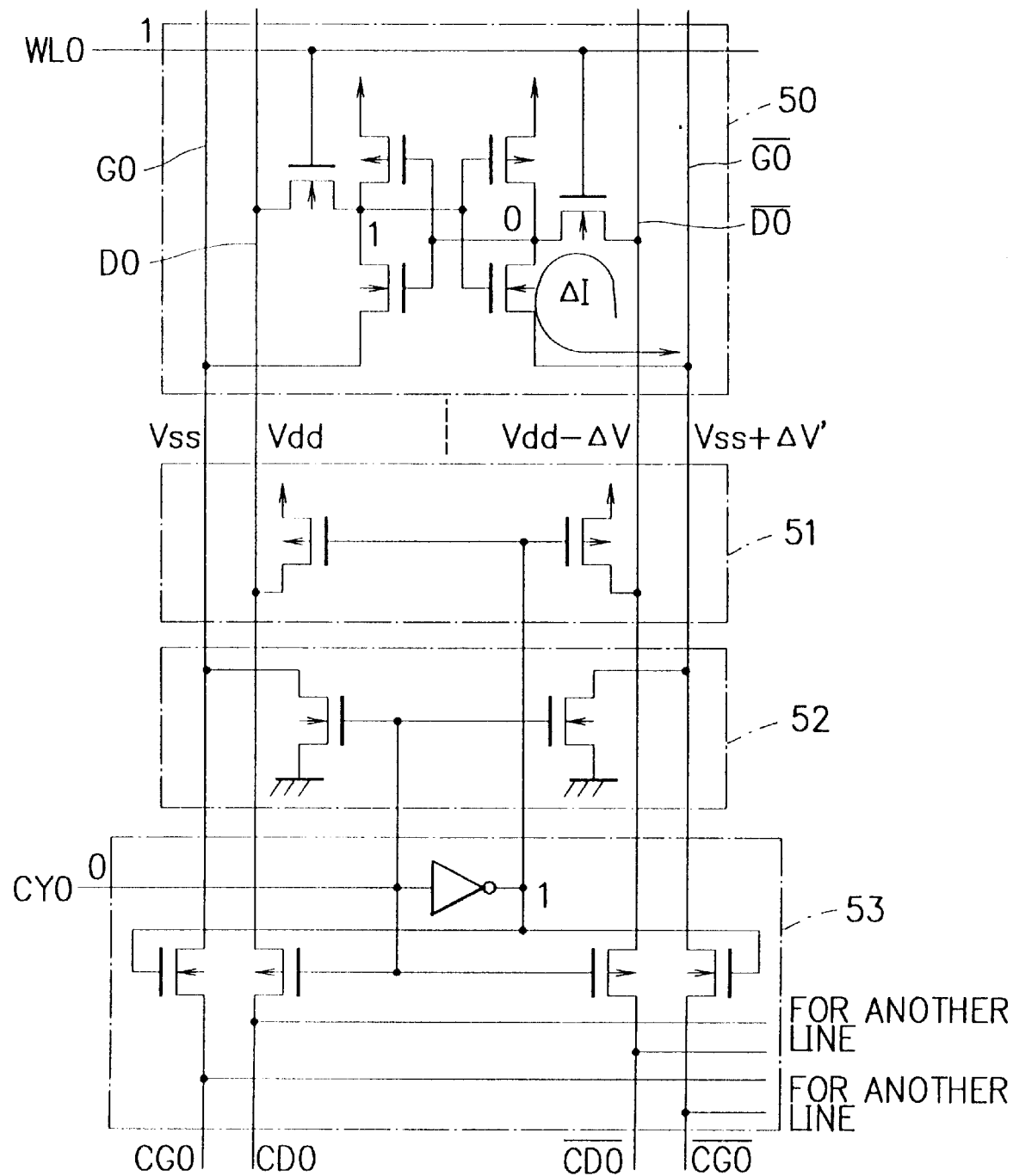
FIG. 17 is a read operation view of SRAM according to the second embodiment of the present invention.

This case is different from the first embodiment, in that as shown in FIG. 17, the gate electrode of the respective MOS transistors constituting the pair of bit line pull-up circuit 51 is not grounded, but the gate electrode is connected to the inverted column selection signal CY0-bar. Furthermore, the gate electrode of the respective MOS transistors constituting the second pair-of-bit-line pull-down circuit 52 is connected to the column selection signal CY0. Here, these transistors are not necessarily the high conductive resistance.

When the column selection signal CY0 is 1, the bit lines D0, D0-bar are set to the power source potential Vdd through the pair-of-bit-line pull-up circuit 51, while one pair of the second bit lines G0, G0-bar are set to the grounded potential Vss through the second pair-of-bit-line pull-down circuit 52. When the column selection signal CY0 comes into 0 so that the word line WL0 is selected, micro current $\Delta I$ flows in the direction of the arrow of FIG. 17. At this time, whole transistors which constitute the pair-of-bit-line pull-up circuit 51, and the second pair-of-bit-line pull-down circuit 52 are of the nonelectric continuity thereby both of a speed that the electric potential of the bit line D0-bar falls, and a speed that the electric potential of the second bit line G0-bar are higher than that of the circuit shown in FIG. 10. When the sense amplifier (not illustrated in FIG. 17) terminates amplification of the read data, the column selection signal CY0 comes into 1 immediately, then pull-up of the bit line and pull-down of the second bit line are started again.

For this reason, it is prevented completely that the data of the another memory cell is destroyed by the fact that the electric potential of the second bit line rises exceedingly.

Figure 18:
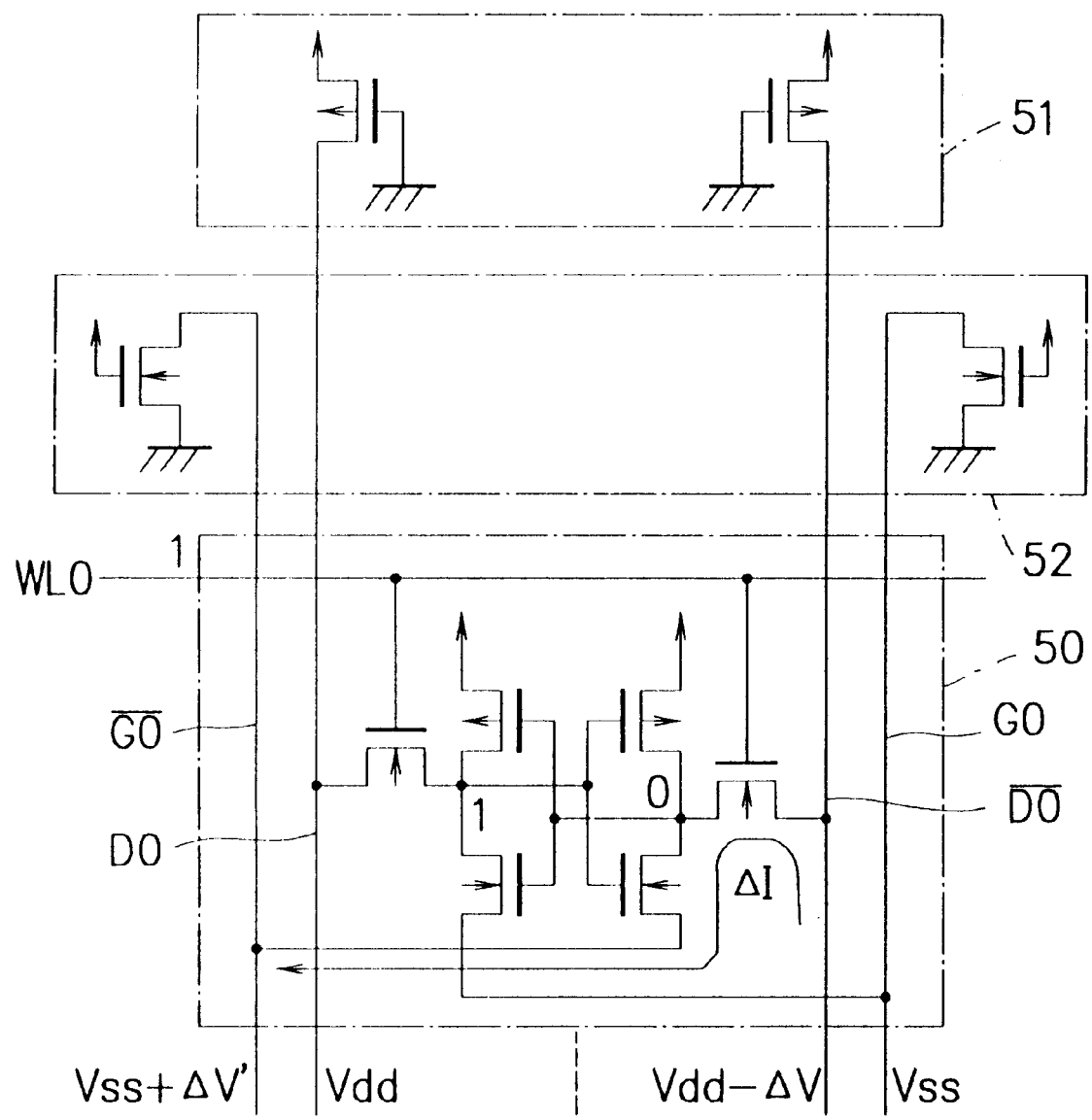
FIG. 18 is a read operation view of SRAM according to the third embodiment of the present invention.

Next, a third embodiment of the present invention will be explained referring to FIG. 18. FIG. 18 is a read operation view in the third embodiment of the present invention. In this case, the second bit line G0 at the side of the bit line D0 is arranged to the another bit line D0-bar adjacently, while the second bit line G0-bar is arranged to the bit line D0 adjacently.

In general, parasitic capacitance is generated between two conductors arranged in parallel through insulator. When the electric potential of one side of the two conductors becomes high, while the electric potential of the other side thereof becomes low, the parasitic capacitance is equivalently doubled (Miller effect). In the case of read operation shown in FIG. 17, the electric potential of the bit line D0-bar falls, simultaneously the electric potential of the second bit line G0-bar rises. However in the embodiment, since these two lines keep way from to be arranged with each other, in both of a set of D0, G0-bar which are adjacent to each other, and a set of D0-bar, G0 which are adjacent to each other, the influence of the Miller effect does not exist. Consequently, wiring capacitance of the bit line and the second bit line becomes comparatively small, thereby cell access speed becomes more fast, and dissipation power becomes small.

As described above, the semiconductor memory device according to the present invention, a pair of the bit lines and a pair of the second bit lines are connected to the memory cell. For this reason, following two great effects are generated. The first effect is that read speed of the memory cell becomes fast. Because the sense amplifier implements voltage amplification by utilizing not only micro potential difference generated at the pair of bit line, but also micro potential difference generated at the second pair of bit line. The second effect is that write time of the memory cell becomes fast. Because the write buffer outputs complementary signal corresponding to the write data to not only the pair-of-bit-line, but also the second pair-of-bit-line, thus supporting data write to the memory cell.

Thus, the SRAM constituting the present invention encourages lowering of voltage, speedup and lowering of dissipation power for the semiconductor memory device.

While preferred embodiments of the invention have been described using specific terms, such description is for illustrative purpose only, and it is to be understood that changes and variations may be made without departing from the spirit or scope of the following claims.

What is claimed is:

1. A semiconductor memory device including a memory cell which comprises a flip-flop circuit coupled to a pair of transferring transistors, wherein said flip-flop circuit includes a pair of load transistors and a pair of driving transistors, said memory cell comprising:

a first pair-of-bit-lines connected to a side of source and drain of said pair of transferring transistors; and a second pair-of-bit-lines connected to a side of source of said pair of driving transistors.

2. A semiconductor memory device as claimed in claim 1, wherein said first pair-of-bit-lines and said second pair-of-bit-lines are connected to a sense amplifier circuit having four input terminals.

3. A semiconductor memory device as claimed in claim 1, wherein said first pair-of-bit-lines and said second pair-of-bit-lines are connected to fouroutput terminals of a write buffer circuit respectively.

4. A semiconductor memory device as claimed in claim 2, wherein in read time of information for said memory cell, a complementary signal is generated between said first pair-of-bit-lines by flowing of current from said first bit line into said second bit line through said transferring transistors and said driving transistors within said memory cell, simultaneously a complementary signal is also generated between said second pair of bit lines due to said current, thus said sense amplifier circuit implements amplification of read information using both of said complementary signal of said first pair-of-bit-lines and said complementary signal of said second pair-of-bit-lines.

5. A semiconductor memory device as claimed in claim 3, wherein in writing time of information for said memory cell, said write buffer circuit outputs a complementary signal based on the write information to both of said first pair-of-bit-lines and said second pair-of-bit-lines, and outputs a equiphase-signal to both of one side of said first bit line of said first pair-of-bit-lines and one side of said second bit line adjacent to said one side of said first bit line of said second pair-of-bit-lines.

6. A semiconductor memory device as claimed in claim 5, wherein said complementary signal outputting to said second pair-of-bit-line is a micro signal.

7. A semiconductor memory device as claimed in claim 1, wherein in the memory cell array section, said first pair-of-bit-lines and the second pair-of-bit-lines are arranged in the same direction in parallel, one side said first bit line of said first pair-of-bit-lines is electrically connected to other side said second bit line which is kept away from said one side first bit line, of said second pair-of-bit-lines through said transferring transistors and said driving transistors.

8. A semiconductor memory device as claimed in claim 2, wherein in the memory cell array section, said first pair-of-bit-lines and the second pair-of-bit-lines are arranged in the same direction in parallel, one side said first bit line of said first pair-of-bit-lines is electrically connected to other side said second bit line which is kept away from said one side first bit line, of said second pair-of-bit-lines through said transferring transistors and said driving transistors.

9. A semiconductor memory device as claimed in claim 3, wherein in the memory cell array section, said first pair-of-bit-lines and the second pair-of-bit-lines are arranged in the same direction in parallel, one side said first bit line of said first pair-of-bit-lines is electrically connected to other side said second bit line which is kept away from said one side first bit line, of said second pair-of-bit-lines through said transferring transistors and said driving transistors.

10. A semiconductor memory device as claimed in claim 4, wherein in the memory cell array section, said first pair-of-bit-lines and the second pair-of-bit-lines are arranged in the same direction in parallel, one side said first bit line of said first pair-of-bit-lines is electrically connected to other side said second bit line which is kept away from said one side first bit line, of said second pair-of-bit-lines through said transferring transistors and said driving transistors.

11. A semiconductor memory device as claimed in claim 5, wherein in the memory cell array section, said first pair-of-bit-lines and the second pair-of-bit-lines are arranged in the same direction in parallel, one side said first bit line of said first pair of bit lines is electrically connected to other side said second bit line which is kept away from said one side first bit line, of said second pair-of-bit-lines through said transferring transistors and said driving transistors.

12. A semiconductor memory device as claimed in claim 6, wherein in the memory cell array section, said first pair-of-bit-lines and the second pair-of-bit-lines are arranged in the same direction in parallel, one side said first bit line of said first pair of bit lines is electrically connected to other side said second bit line which is kept away from said one side first bit line, of said second pair-of-bit-lines through said transferring transistors and said driving transistors.

* * * * *